(12) United States Patent
Lin et al.

(10) Patent No.: US 10,290,513 B2
(45) Date of Patent: May 14, 2019

(54) CARRIER WARPAGE CONTROL FOR THREE DIMENSIONAL INTEGRATED CIRCUIT (3DIC) STACKING

(71) Applicant: Taiwan Semiconductor Manufacturing Company, Ltd., Hsinchu (TW)

(72) Inventors: Jing-Cheng Lin, Hsinchu (TW); Shih Ting Lin, Taipei (TW); Chen-Hua Yu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 16/050,954

(22) Filed: Jul. 31, 2018

(65) Prior Publication Data

US 2018/0337065 A1    Nov. 22, 2018

Related U.S. Application Data

(62) Division of application No. 13/779,554, filed on Feb. 27, 2013, now Pat. No. 10,153,179.

(Continued)

(51) Int. Cl.
*H01L 21/56* (2006.01)
*H01L 23/00* (2006.01)
(Continued)

(52) U.S. Cl.
CPC ............ *H01L 21/56* (2013.01); *H01L 21/561* (2013.01); *H01L 21/563* (2013.01);
(Continued)

(58) Field of Classification Search
CPC . H01L 21/56; H01L 23/3128; H01L 25/0657; H01L 21/561; H01L 21/568; H01L 24/96; H01L 24/97; H01L 2225/06562; H01L 2225/06565; H01L 2225/06541; H01L 2225/06513; H01L 2924/157; H01L 2924/1434; H01L 2924/1431; H01L 2225/06517; H01L 2224/81005; H01L 2224/131; H01L 24/92; H01L 24/83; H01L 24/81; H01L 2924/18161; H01L 2224/83005;
(Continued)

(56) References Cited

U.S. PATENT DOCUMENTS 6,452,278 B1    9/2002   DiCaprio et al.
7,655,501 B2    2/2010   Yang et al.
(Continued)

FOREIGN PATENT DOCUMENTS

CN    101202253 A    6/2008
CN    102024802 A    4/2011
(Continued)

*Primary Examiner* — Savitri Mulpuri
(74) *Attorney, Agent, or Firm* — Slater Matsil, LLP

(57) ABSTRACT

An embodiment method of forming a package-on-package (PoP) device includes temporarily mounting a substrate on a carrier, stacking a first die on the substrate, at least one of the die and the substrate having a coefficient of thermal expansion mismatch relative to the carrier, and stacking a second die on the first die. The substrate may be formed from one of an organic substrate, a ceramic substrate, a silicon substrate, a glass substrate, and a laminate substrate.

10 Claims, 12 Drawing Sheets

Related U.S. Application Data

(60) Provisional application No. 61/693,083, filed on Aug. 24, 2012.

(51) Int. Cl.
*H01L 23/31* (2006.01)
*H01L 25/065* (2006.01)

(52) U.S. Cl.
CPC ........ *H01L 21/568* (2013.01); *H01L 23/3128* (2013.01); *H01L 24/96* (2013.01); *H01L 24/97* (2013.01); *H01L 25/0657* (2013.01); H01L 24/13 (2013.01); H01L 24/16 (2013.01); H01L 24/32 (2013.01); H01L 24/73 (2013.01); H01L 24/81 (2013.01); H01L 24/83 (2013.01); H01L 24/92 (2013.01); H01L 2224/131 (2013.01); H01L 2224/16145 (2013.01); H01L 2224/16225 (2013.01); H01L 2224/17181 (2013.01); H01L 2224/32145 (2013.01); H01L 2224/32225 (2013.01); H01L 2224/73204 (2013.01); H01L 2224/81005 (2013.01); H01L 2224/83005 (2013.01); H01L 2224/92125 (2013.01); H01L 2224/97 (2013.01); H01L 2225/06513 (2013.01); H01L 2225/06517 (2013.01); H01L 2225/06541 (2013.01); H01L 2225/06562 (2013.01); H01L 2225/06565 (2013.01); H01L 2924/141 (2013.01); H01L 2924/1431 (2013.01); H01L 2924/1434 (2013.01); H01L 2924/157 (2013.01); H01L 2924/15311 (2013.01); H01L 2924/15787 (2013.01); H01L 2924/15788 (2013.01); H01L 2924/18161 (2013.01); H01L 2924/351 (2013.01); H01L 2924/3511 (2013.01)

(58) Field of Classification Search
CPC ......... H01L 2924/141; H01L 2924/351; H01L 24/13; H01L 24/16; H01L 24/32; H01L 24/73; H01L 2224/16145; H01L 2224/32145; H01L 2924/00012; H01L 2224/97; H01L 2224/81; H01L 2924/15311; H01L 2224/73204; H01L 2224/92125; H01L 2224/16225; H01L 2224/32225; H01L 2924/00; H01L 2924/3511; H01L 2924/15788; H01L 2924/15787
See application file for complete search history.

(56) References Cited

U.S. PATENT DOCUMENTS

| | | |
|---|---|---|
| 7,915,080 B2 | 3/2011 | Takahashi |
| 8,017,445 B1 | 9/2011 | Chang et al. |
| 8,304,874 B2 | 11/2012 | Lee et al. |
| 8,471,374 B2 | 6/2013 | Kim et al. |
| 9,064,883 B2 | 6/2015 | Meyer et al. |
| 2007/0096332 A1 | 5/2007 | Satoh et al. |
| 2010/0133704 A1 | 6/2010 | Marimuthu et al. |
| 2010/0244233 A1 | 9/2010 | Kim et al. |
| 2011/0024890 A1 | 2/2011 | Yang et al. |
| 2011/0062592 A1 | 3/2011 | Lee et al. |
| 2011/0068459 A1 | 3/2011 | Pagaila et al. |
| 2011/0266693 A1 | 11/2011 | Simmons-Matthews |
| 2011/0278721 A1 | 11/2011 | Choi et al. |
| 2011/0278732 A1 | 11/2011 | Yu et al. |
| 2011/0287582 A1 | 11/2011 | Shimada et al. |
| 2012/0032340 A1 | 2/2012 | Choi et al. |
| 2012/0070936 A1 | 3/2012 | Guha et al. |
| 2012/0070939 A1 | 3/2012 | Dunne et al. |
| 2012/0074585 A1 | 3/2012 | Koo et al. |
| 2012/0074587 A1 | 3/2012 | Koo et al. |
| 2012/0111923 A1 | 5/2012 | Lee et al. |
| 2012/0181673 A1 | 7/2012 | Pagaila et al. |
| 2013/0155639 A1 | 6/2013 | Ogawa et al. |
| 2013/0214401 A1 | 8/2013 | Lin et al. |
| 2013/0277841 A1 | 10/2013 | Lii et al. |

FOREIGN PATENT DOCUMENTS

| | | |
|---|---|---|
| CN | 102456588 A | 5/2012 |
| CN | 102543772 A | 7/2012 |
| KR | 20100109241 A | 10/2010 |
| KR | 20101184470 | 9/2012 |
| WO | 2008129424 A | 10/2008 |

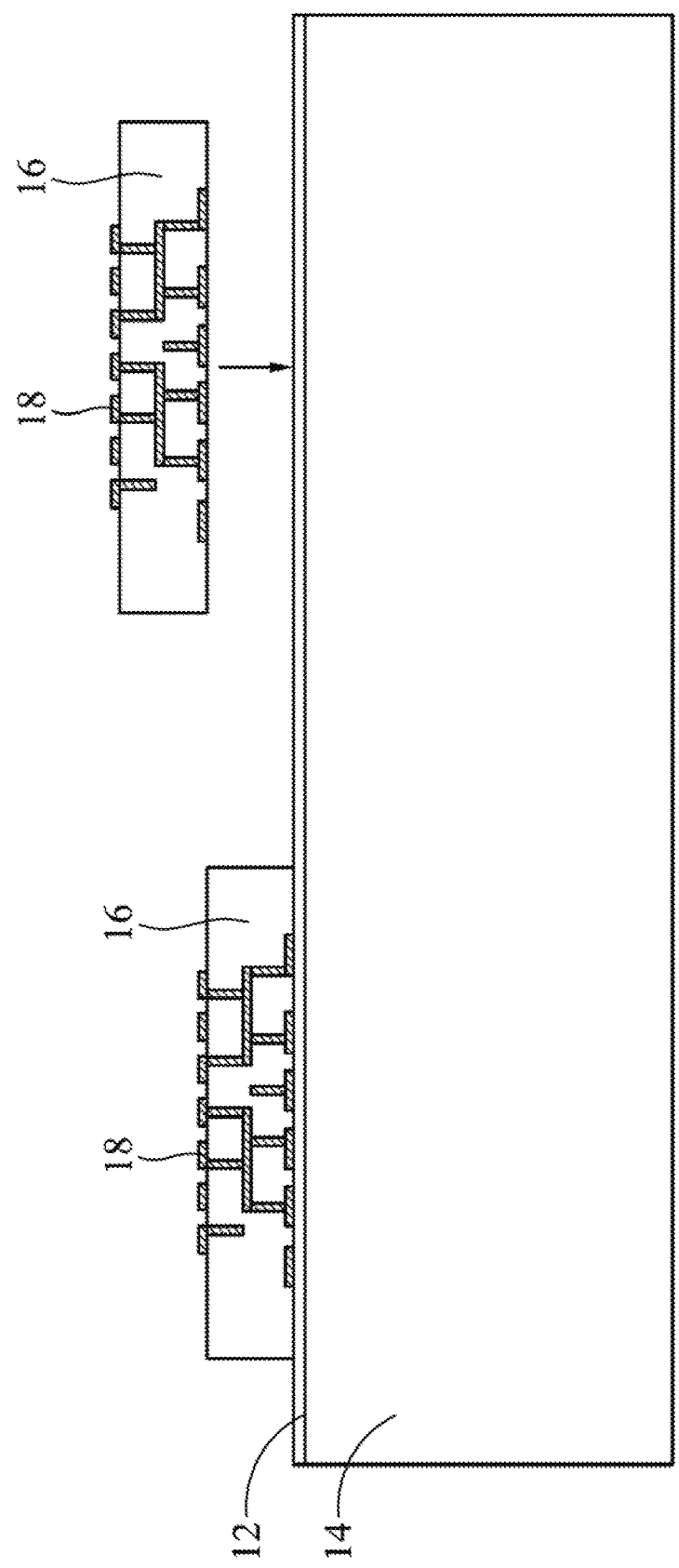

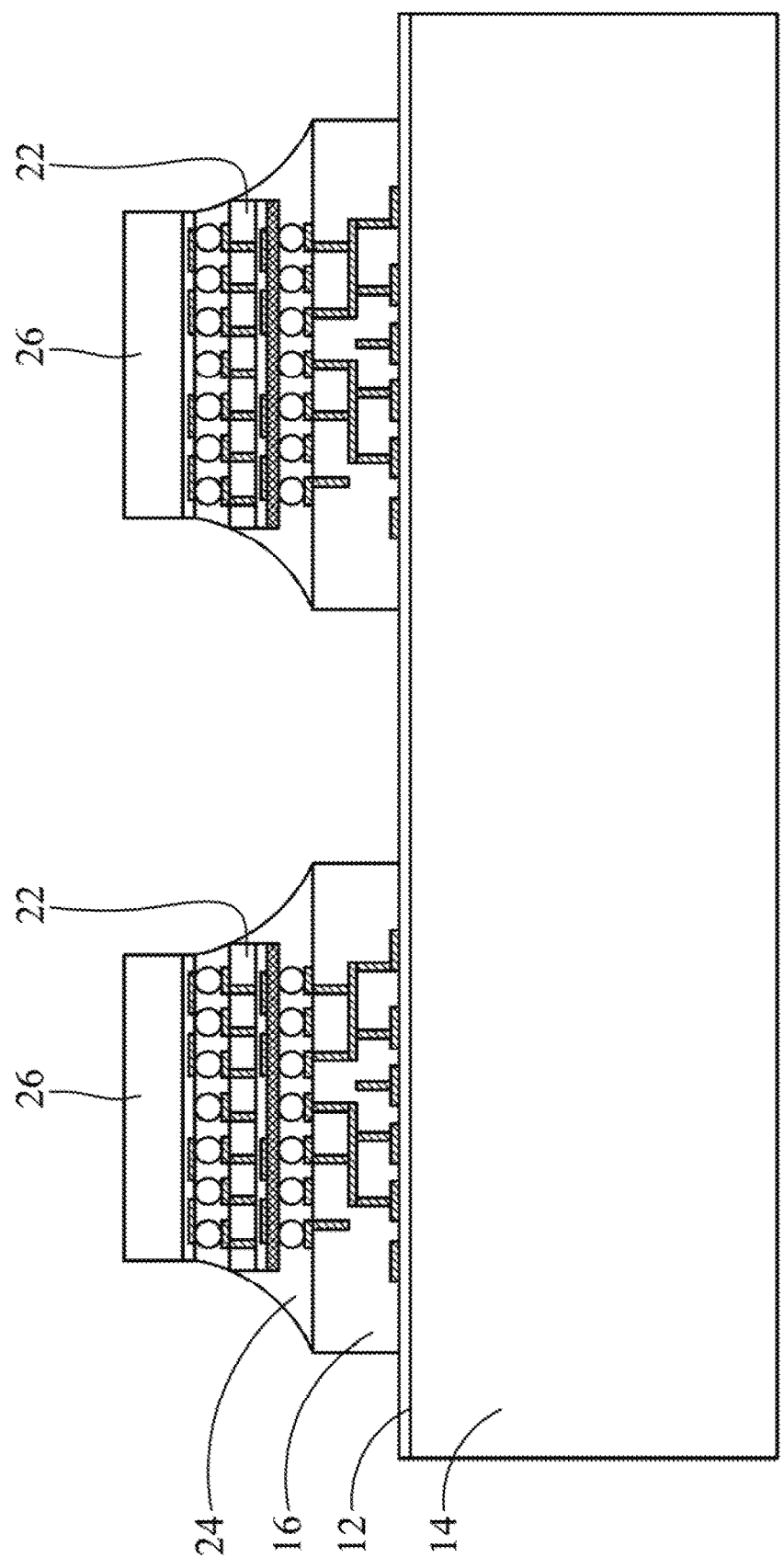

CARRIER WARPAGE CONTROL FOR THREE DIMENSIONAL INTEGRATED CIRCUIT (3DIC) STACKING

CROSS-REFERENCE TO RELATED APPLICATIONS

This application is a divisional of U.S. patent application Ser. No. 13/779,554, filed on Feb. 27, 2013 and entitled "Carrier Warpage Control for Three Dimensional Integrated Circuit (3DIC) Stacking," which claims the benefit of U.S. Provisional Application No. 61/693,083, filed on Aug. 24, 2012, entitled "Carrier Warpage Control for 3DIC Stacking," which applications are hereby incorporated herein by reference.

BACKGROUND

As the demand for smaller electronic products grows, manufacturers and others in the electronics industry continually seek ways to reduce the size of integrated circuits used in the electronic products. In that regard, three-dimensional type integrated circuit packaging techniques have been developed and used.

One packaging technique that has been developed is Package-on-Package (PoP). As the name implies, PoP is a semiconductor packaging innovation that involves stacking one package on top of another package. A PoP device may combine vertically discrete memory and logic packages.

Unfortunately, conventional processes used to fabricate the PoP devices may not be able to sufficiently prevent the packages from warping. This is particularly true when relatively thin dies or integrated circuits are being stacked.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 1A-1I collectively illustrate an embodiment method of forming a PoP device using a carrier to inhibit or prevent warping in stacked dies;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently present embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to present embodiments in a specific context, namely a package-on-package (PoP) semiconductor device. The concepts in the disclosure may also apply, however, to other semiconductor structures or circuits.

Figure 1A:
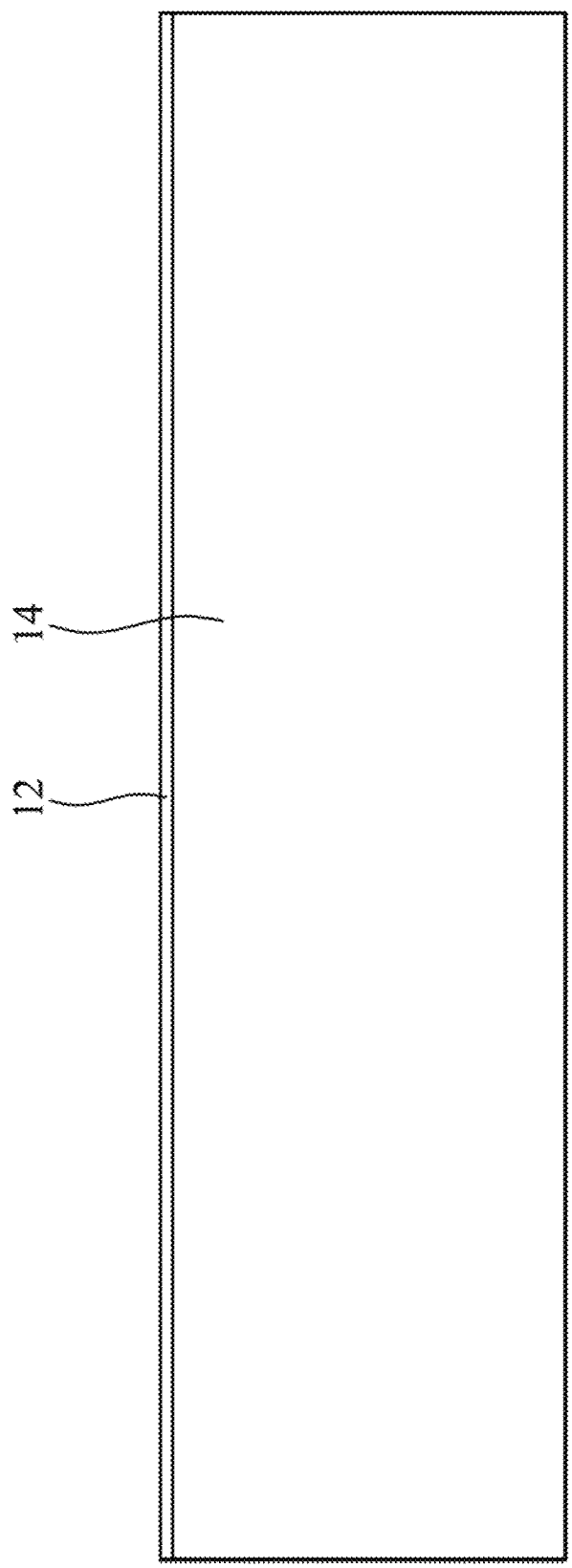

Referring now to FIGS. 1A-1I, an embodiment method of forming a PoP device 10 (FIGS. 2-4) is collectively illustrated. As shown in FIG. 1A, glue 12 or another suitable bonding material is deposited or formed on a carrier 14. In an embodiment, the carrier 14 is formed from glass, silicon, a material having a low coefficient of thermal expansion, or another suitable carrier material. Indeed, the carrier 14 is generally a higher modulus material with good stiffness.

Referring now to FIG. 1B, a substrate 16 is temporarily mounted on the carrier 14 using the glue 12 or other suitable bonding material. In an embodiment, the substrate 16 is an organic substrate, a ceramic substrate, a silicon substrate, a glass substrate, or a laminate substrate having or supporting metal interconnects 18 or metallization. In an embodiment, the substrate 16 is formed from an epoxy, a resin, or another material.

Figure 1C:
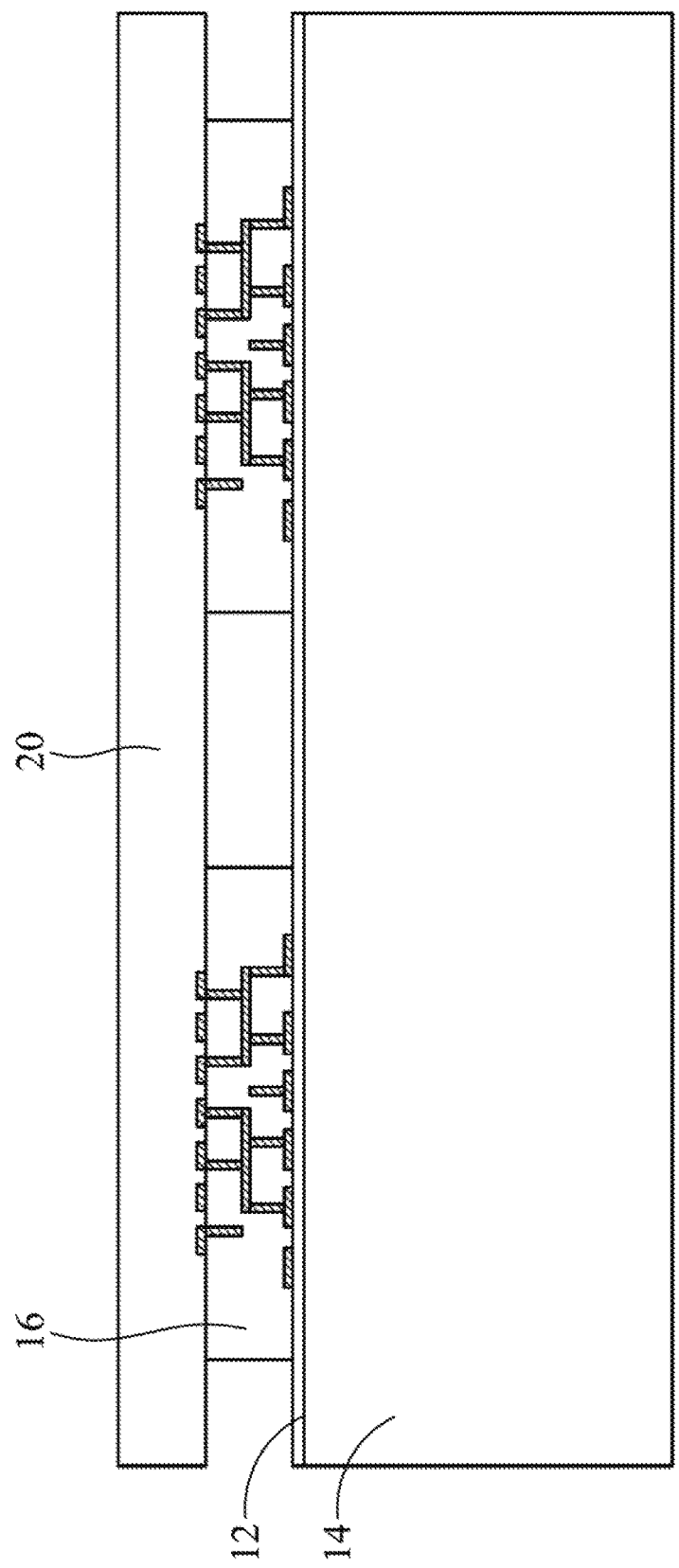

Referring now to FIG. 1C, in an embodiment a pressure anneal is performed after the substrate 16 has been temporarily mounted on the carrier 14 as shown in FIG. 1B. The pressure anneal generally biases the substrate 16 toward the carrier 14. This ensures that the substrate 16 is securely mounted, albeit temporarily, on the carrier 14. In an embodiment, the pressure anneal of FIG. 1C is performed using a pressure anneal cap 20 along with heating. In an embodiment, pressure anneal may be performed later in the embodiment method illustrated in FIGS. 1A-1I. For example, the pressure anneal may be performed on a wafer, on a panel, on a single unit, or on multiple units. In addition, in an embodiment the pressure anneal includes pressure only without the application of heat.

Figure 1D:
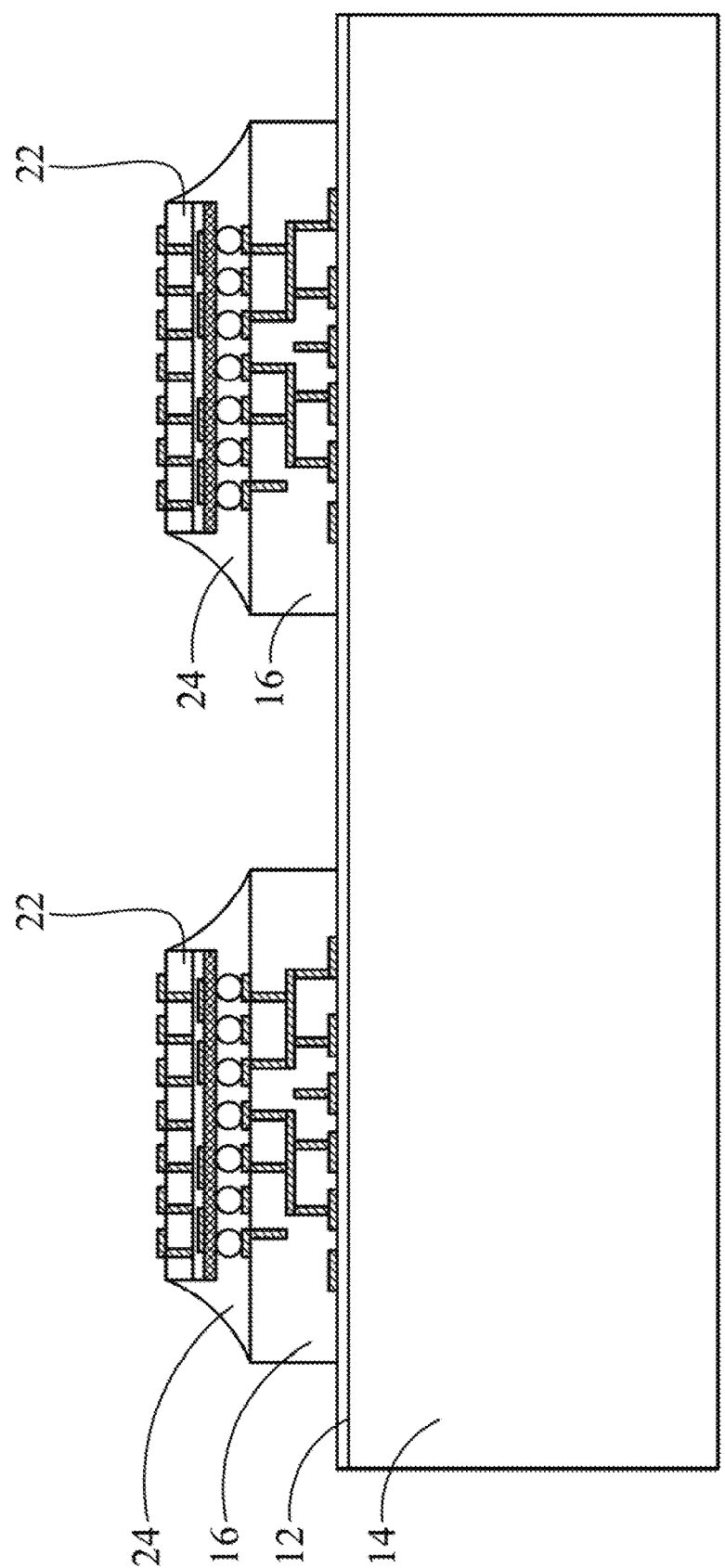

Referring now to FIG. 1D, after the pressure anneal cap 20 of FIG. 1C has been removed, a first die 22 is attached to the substrate 16 using, for example, solder balls and corresponding contact pads. The first die 22 may include logic components (a logic integrated circuit, analog circuit, etc.), a memory component, and so on. The substrate 16 and/or the die 22 generally have a material coefficient of thermal expansion mismatch relative to the carrier 14. As will be more fully explained below, any warping of, for example, dies or other semiconductor structures stacked on or over the substrate 16 is inhibited or prevented.

After placing the first die 22, an underfill material 24 may be flowed between the first die 22 and the substrate 16. In an embodiment, the underfill material 24 is omitted between the first die 22 and the substrate 16.

Referring now to FIG. 1E, after the first die 22 has been mounted, a second die 26 is attached over the first die 22 using, for example, solder balls and corresponding contact pads. The second die 26 may include logic components (a logic integrated circuit, analog circuit, etc.), a memory component, and so on. Notably, the stacking of the second die 26 upon the first die 22 generally forms the PoP devices 10.

After placing the second die 26 as shown in FIG. 1E, an underfill material 24 may be flowed between the second die 26 and the first die 22. In an embodiment, the underfill material 24 is omitted. As will be more fully explained below, in an embodiment the second die 26 may be horizontally offset relative to the first die 22 to provide the second die 26 with an overhang.

Figure 1F:
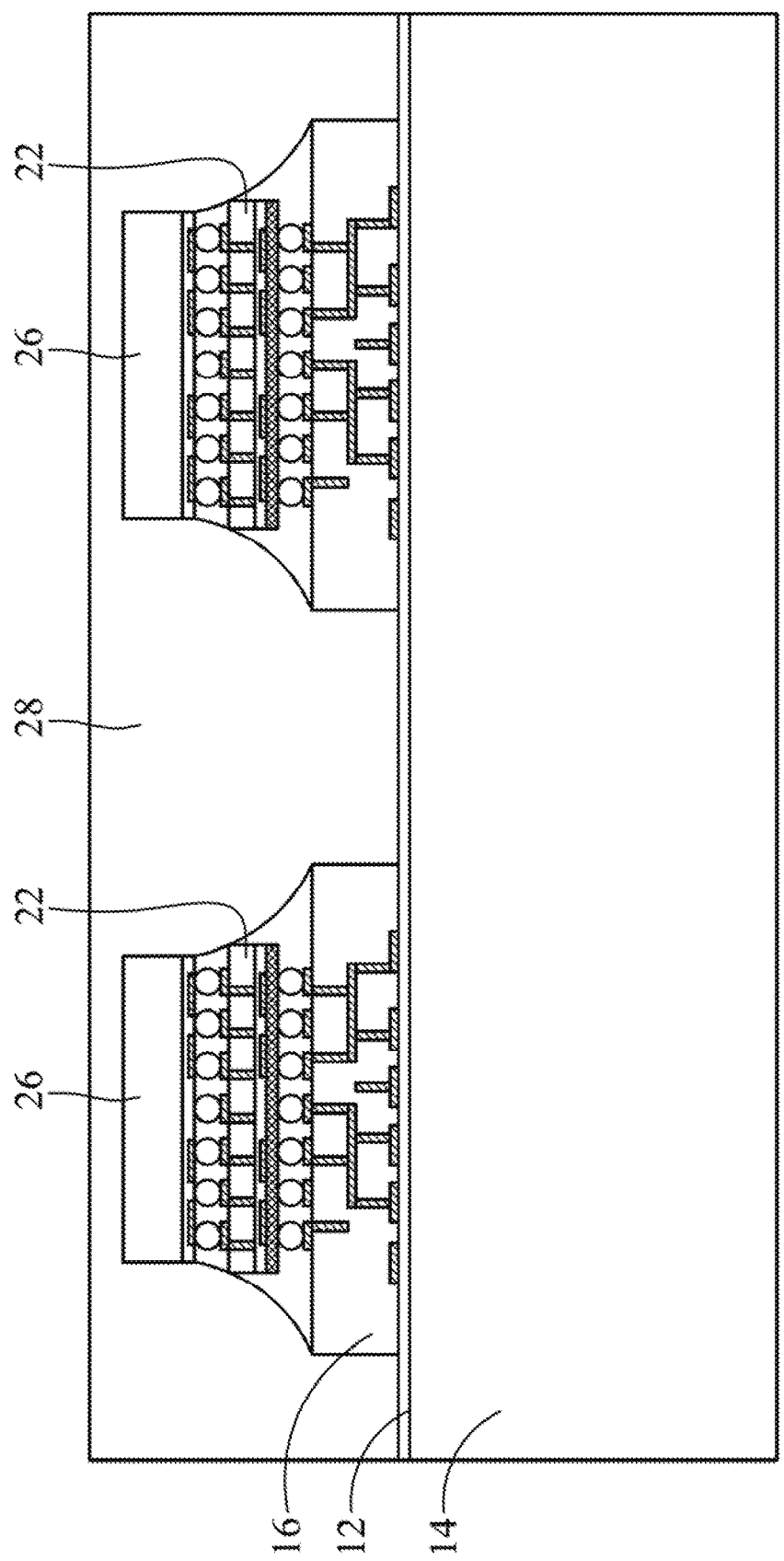

Referring now to FIG. 1F, after the second die 26 has been mounted, a molding material 28 is formed over, for example, exposed portions of the substrate 16, the first die 22, and the second die 26. In an embodiment, the molding material 28 is also formed over the glue 12 disposed on the carrier 14 and adjacent to the substrate 16. In an embodiment, the molding material 28 generally encapsulates the first and second dies 22, 26.

Figure 1G:
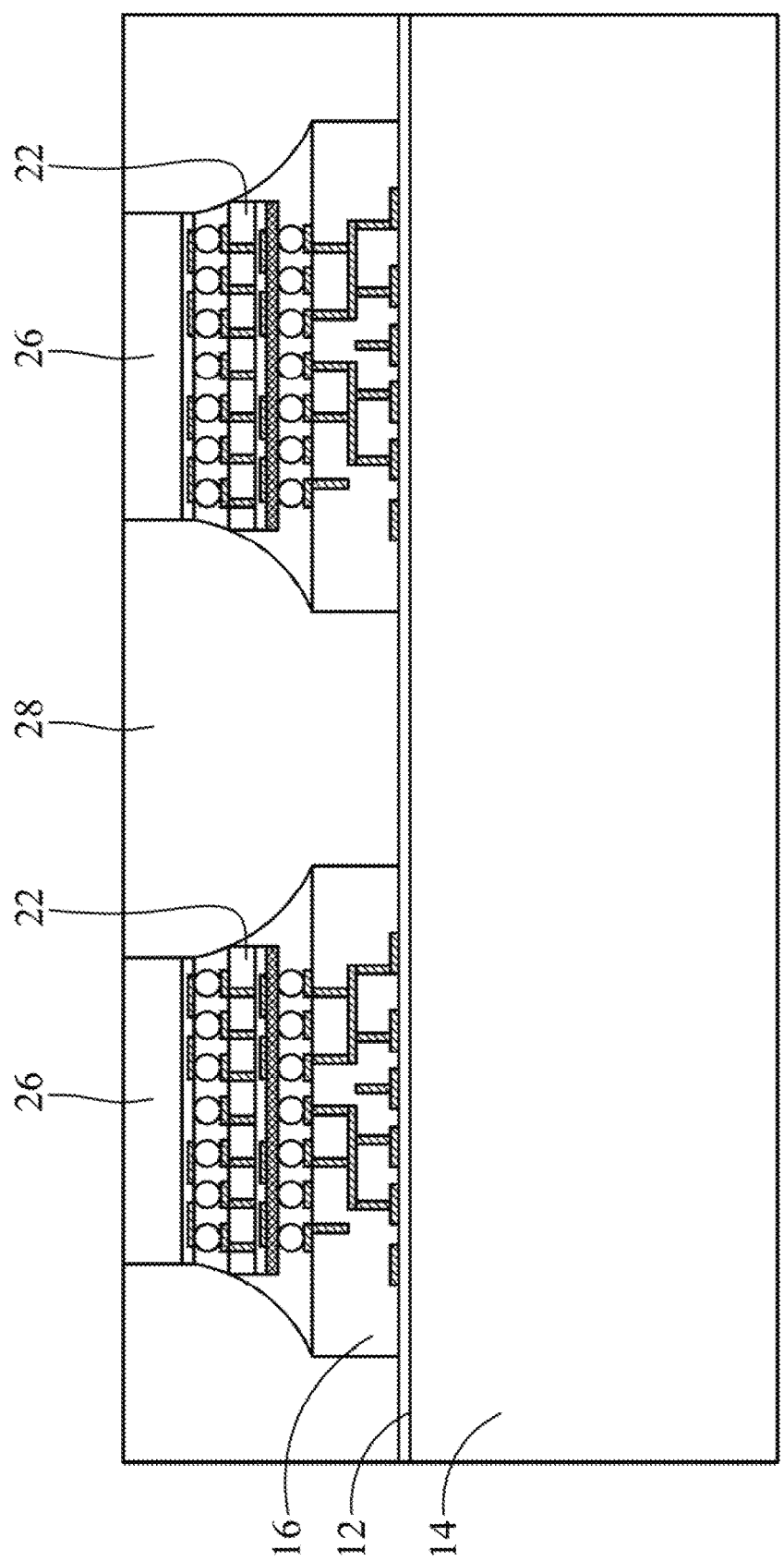

Referring now to FIG. 1G, after the molding material 28 has been formed over the first and second dies 22, 26, a grinding process is performed to remove an upper portion of the molding material 28. As shown, the grinding process may expose a top surface of the second die 26. However, in an embodiment, the grinding process may leave a portion or thin layer of the molding material 28 disposed over the second die 26.

Figure 1H:
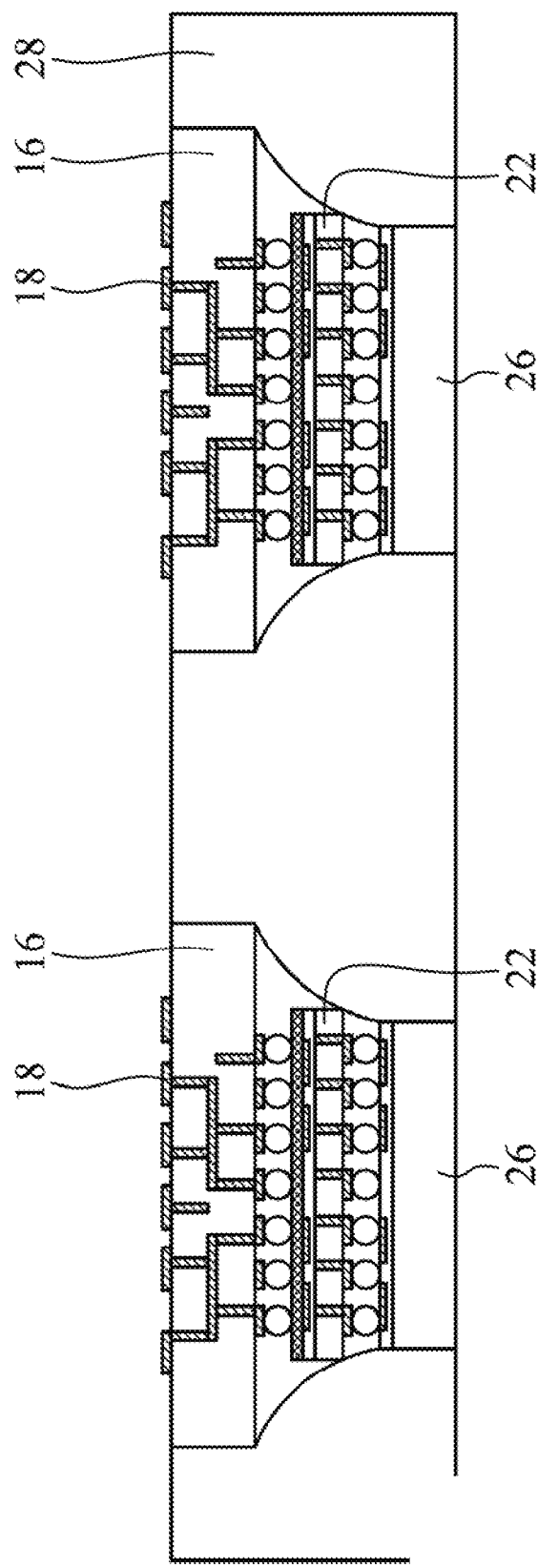

Referring now to FIG. 1H, after the grinding process has been performed, the assembly is flipped over and a de-bonding process is performed to remove the carrier 14 from the substrate 16. In addition, a cleaning process is performed to remove the glue 12 from the substrate 16 and the molding material 28. Once the de-bonding and cleaning processes have been performed, contact pads from the metal interconnects 18 of the substrate 16 are exposed.

Figure 1I:
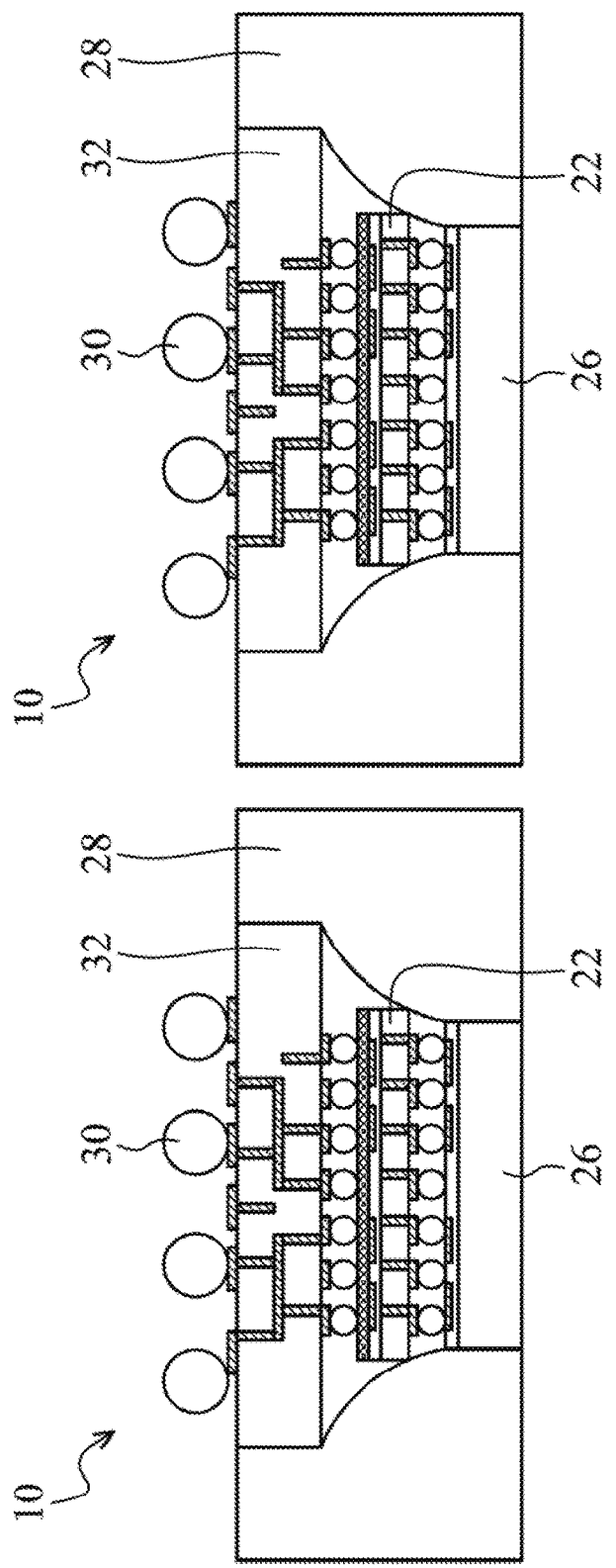

Referring now to FIG. 1I, after the de-bonding and cleaning processes have been performed, a ball mount process is performed to form an array of solder balls 30 on the contact pads from the metal interconnects 18 of the substrate 16. In addition, a wafer saw process is performed to separate the PoP devices 10 from each other. As shown in FIG. 1I, after the wafer saw process a portion of the molding material 28 still covers the sidewalls 32 of the substrate 16. However, in an embodiment the wafer saw process removes the molding material 28 from the sidewalls 32 of the substrate 16.

Figure 2:
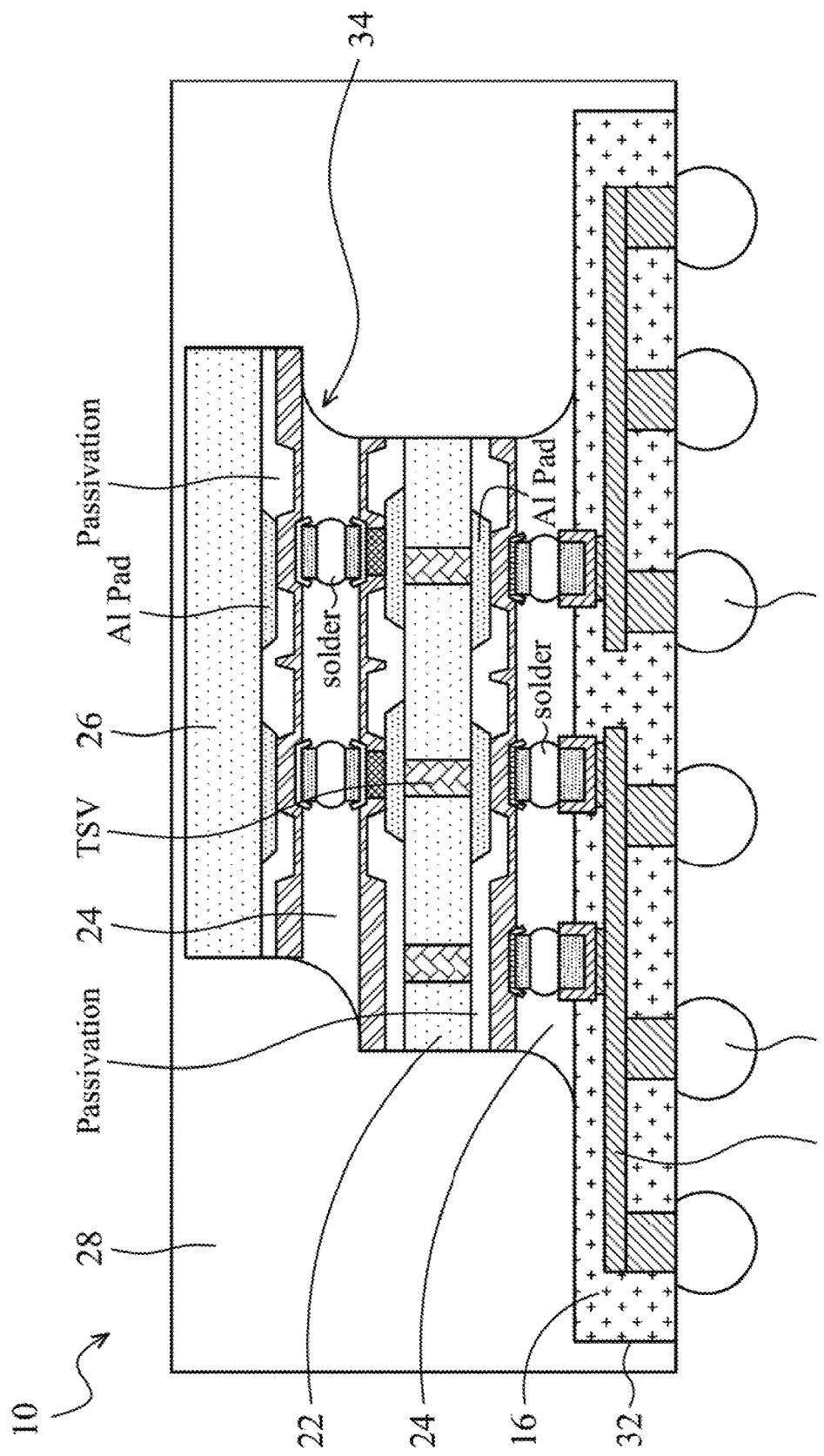
FIG. 2 illustrates a cross sectional view of an embodiment PoP device formed using the method of FIGS. 1A-1I.

Referring to FIG. 2, an embodiment PoP device 10 formed using an embodiment method is illustrated. As shown, the PoP device 10 includes a first die 22 stacked on the substrate 16 and a second die 26 stacked on the first die 22. In an embodiment, the second die 26 is horizontally offset relative to the first die 22 to provide the second die 26 with the overhang 34 noted above.

In an embodiment, the underfill material 24 is disposed between the substrate 16 and the first die 22 as well as between the first die 22 and the second die 26. In an embodiment, the underfill material 24 is disposed between the substrate 16 and the first die 22 only. In an embodiment, the underfill material 24 is disposed between the first die 22 and the second die 26 only. In addition, the molding material 28 of the PoP device 10 has been formed around portions of the substrate 16, the first die 22, and the second die 26. In an embodiment, the molding material 28 is omitted.

Still referring to FIG. 2, the substrate 16 of the PoP device 10 supports metal interconnects 18 and/or other connection structures (e.g., under bump metallization) used to electrically couple the solder balls 30 (i.e., the ball grid array) to the first die 22. The PoP device 10 may also include other structures, layers, or materials such as, for example, passivation layers, through silicon vias (TSVs), aluminum pads, solder, and so on.

Figure 3:
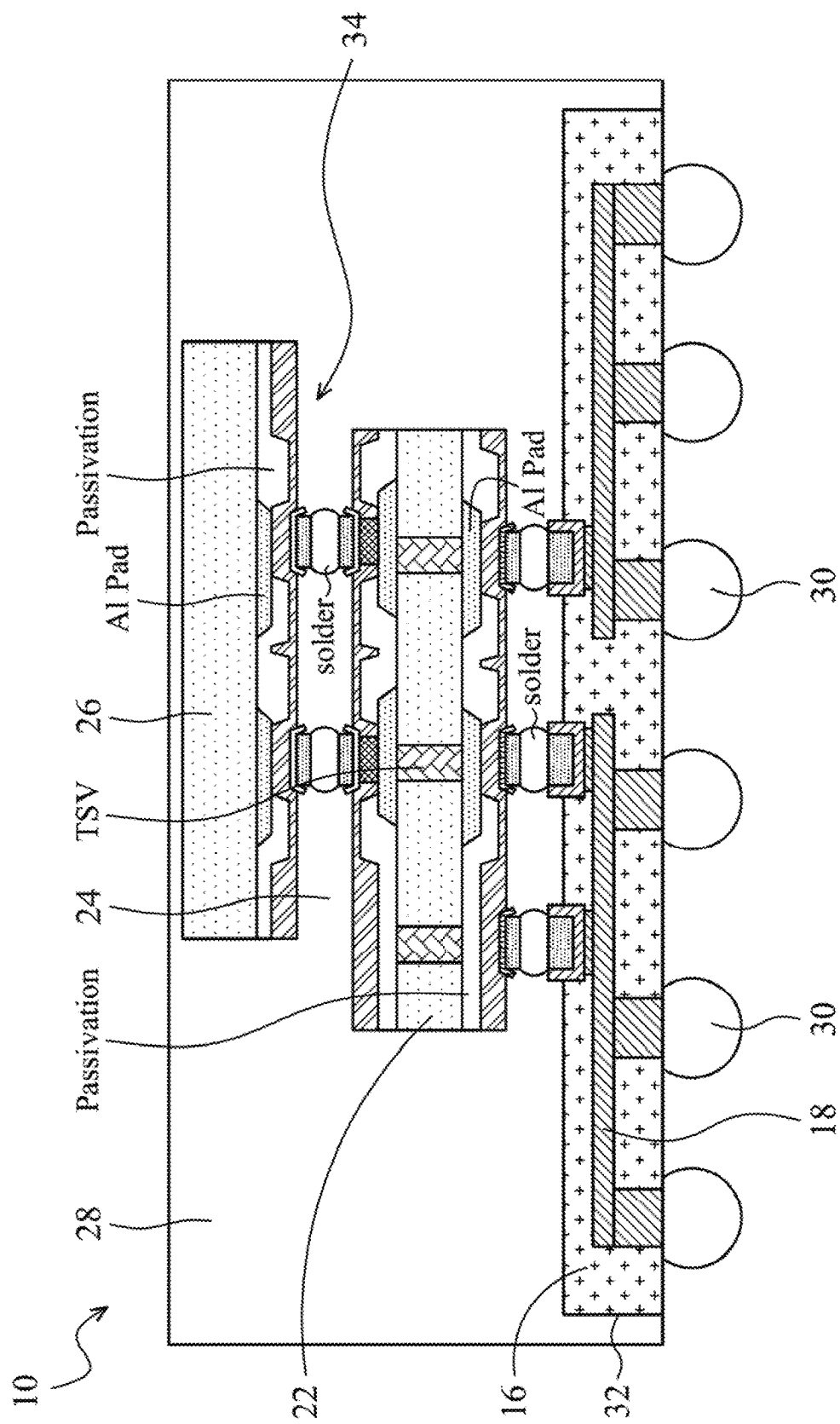
FIG. 3 illustrates a cross sectional view of an embodiment PoP device formed using the method of FIGS. 1A-1I without any underfill.

Referring now to FIG. 3, in an embodiment the underfill material 24 of FIG. 2 has been omitted from the PoP device 10 and replaced by the molding material 28. In other words, the molding material 28 functions or preforms as an underfill in the embodiment PoP device 10 of FIG. 3.

Figure 4:
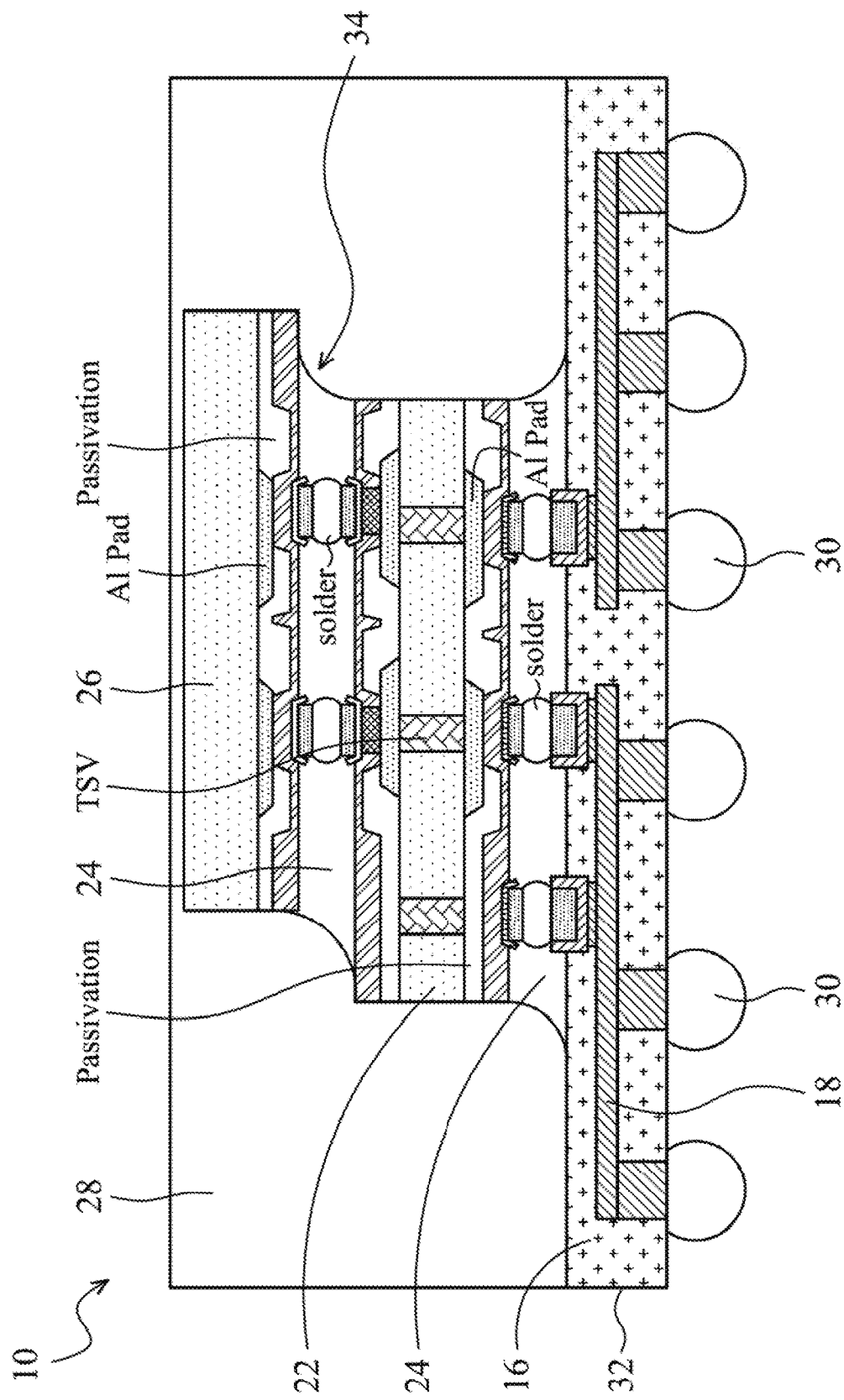
FIG. 4 illustrates a cross sectional view of an embodiment PoP device formed using the method of FIGS. 1A-1I without any molding on sidewalls of the substrate.

Referring now to FIG. 4, in an embodiment the molding material 28 is left off or removed from sidewalls 32 of the substrate 16. By way of example, the molding material 28 may not be formed on the sidewalls 32 when the molding material 28 is deposited during the molding process of FIG. 1F. In other words, the molding material 28 is prevented from forming on the sidewalls 32. In another example, the molding material 28 may be removed from the sidewalls 32 of the substrate 16 using the wafer saw process of FIG. 1I. In other words, the wafer saw removes the molding material 28 from the sidewalls 32.

It should be recognized that the embodiment methods and PoP device 10 provide numerous advantages. Indeed, by using the carrier 14 during the stacking of dies 22, 26 warping is inhibited or prevented, even when relatively thin dies are stacked. In addition, multiple dies may be stacked, either with or without an overhang.

An embodiment method of forming a package-on-package (PoP) device includes temporarily mounting a substrate on a carrier, stacking a first die on the substrate, at least one of the die and the substrate having a coefficient of thermal expansion mismatch relative to the carrier, and stacking a second die on the first die.

An embodiment method of forming a package-on-package (PoP) device includes temporarily mounting a substrate on a carrier, stacking a plurality of dies over the substrate, at least one of the plurality of dies and the substrate having a coefficient of thermal expansion mismatch relative to the carrier, and removing the carrier after the plurality of dies have been stacked.

A embodiment method of forming a package-on-package (PoP) device includes temporarily mounting a substrate on a carrier, stacking a first die on the substrate, at least one of the first die and the substrate having a coefficient of thermal expansion mismatch relative to the carrier, stacking a second die on the first die, the second die horizontally offset relative to the first die to provide the second die with an overhang, and flowing an underfill material between the first die and the substrate and between the first die and the second die.

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:
1. A package-on-package (PoP) device comprising:
a substrate having conductive features;
a first die over the substrate and electrically coupled to the conductive features of the substrate, wherein the first die comprises:
a first substrate, a first side of the first substrate facing the substrate, a second side of the first substrate facing away from the substrate;
through vias in the first substrate extending from the first side of the first substrate to the second side of the first substrate;
first aluminum pads contacting and extending along the first side of the first substrate;
second aluminum pads contacting and extending along the second side of the first substrate, wherein each of the through vias is disposed between a respective first aluminum pad and a respective second aluminum pad;
a first passivation layer along the first side of the first substrate, wherein the first passivation layer covers first portions of the first aluminum pads and exposes second portions of the first aluminum pads;

a second passivation layer along the second side of the first substrate, wherein the second passivation layer covers first portions of the second aluminum pads and exposes second portions of the second aluminum pads;

first conductive pillars proximate the first side of the first substrate and electrically coupled to the exposed second portions of the first aluminum pads; and second conductive pillars proximate the second side of the first substrate and electrically coupled to the exposed second portions of the second aluminum pads, wherein the first conductive pillars are bonded to the substrate;

a second die over the first die and electrically coupled to the first die, wherein the second die is horizontally offset relative to the first die;

a first underfill material between the first die and the substrate;

a second underfill material between the second die and the first die; and a molding material over the substrate, around the first die, and around the second die, wherein the molding material is different from the first underfill material.

2. The PoP device of claim 1, further comprising:

first solder regions between the first conductive pillars and the substrate; and second solder regions between the second conductive pillars and the second die.

3. The PoP device of claim 2, wherein the first conductive pillars are spaced apart from the first passivation layer, and the second conductive pillars are spaced apart from the second passivation layer.

4. The PoP device of claim 1, wherein the substrate is an organic substrate, a ceramic substrate, a silicon substrate, a glass substrate, or a laminate substrate.

5. The PoP device of claim 1, wherein the conductive features comprise conductive lines and vias.

6. The PoP device of claim 1, wherein sidewalls of the first substrate are free of the molding material.

7. The PoP device of claim 1, wherein the first die further comprises:

a first dielectric layer along a first side of the first passivation layer distal to the first substrate, wherein the first passivation layer is separated from the first conductive pillars by the first dielectric layer.

8. The PoP device of claim 7, wherein the first dielectric layer physically contacts the first aluminum pads.

9. The PoP device of claim 7, wherein the first die further comprises:

a second dielectric layer along a second side of the second passivation layer distal to the first substrate, wherein the second passivation layer is separated from the second conductive pillars by the second dielectric layer.

10. The PoP device of claim 9, wherein the first dielectric layer physically contacts the first aluminum pads, and the second dielectric layer physically contacts the second aluminum pads.

* * * * *